United States Patent
Li et al.

(10) Patent No.: US 7,060,586 B2
(45) Date of Patent: Jun. 13, 2006

(54) PCMO THIN FILM WITH RESISTANCE RANDOM ACCESS MEMORY (RRAM) CHARACTERISTICS

(75) Inventors: Tingkai Li, Vancouver, WA (US); Wei-Wei Zhuang, Vancouver, WA (US); David R. Evans, Beaverton, OR (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 161 days.

(21) Appl. No.: 10/836,689

(22) Filed: Apr. 30, 2004

(65) Prior Publication Data

US 2005/0245039 A1    Nov. 3, 2005

(51) Int. Cl.
*H01L 21/20*   (2006.01)
*H01L 29/00*   (2006.01)

(52) U.S. Cl. ............ 438/385; 438/382; 438/384; 257/536; 257/537

(58) Field of Classification Search ............ 438/385, 438/382, 384; 257/536, 537
See application file for complete search history.

(56) References Cited

U.S. PATENT DOCUMENTS

| | | | |
|---|---|---|---|
| 6,673,691 B1* | 1/2004 | Zhuang et al. | 438/382 |
| 6,759,249 B1* | 7/2004 | Zhuang et al. | 438/3 |
| 6,834,008 B1* | 12/2004 | Rinerson et al. | 365/158 |
| 2003/0183878 A1* | 10/2003 | Tajiri et al. | 257/350 |

* cited by examiner

*Primary Examiner*—Michael Trinh
(74) *Attorney, Agent, or Firm*—Law Office of Gerald Maliszewski; Gerald Maliszewski

(57) ABSTRACT

PrCaMnO (PCMO) thin films with predetermined memory-resistance characteristics and associated formation processes have been provided. In one aspect the method comprises: forming a $Pr^{3+}_{1-x}Ca^{2+}_{x}MnO$ thin film composition, where $0.1<x<0.6$; in response to the selection of x, varying the ratio of Mn and O ions as follows: $O^{2-}(3\pm20\%)$; $Mn^{3+}((1-x)\pm20\%)$; and, $Mn^{4+}(x\pm20\%)$. When the PCMO thin film has a $Pr^{3+}_{0.70}Ca^{2+}_{0.30}Mn^{3+}_{0.78}Mn^{4+}_{0.22}O^{2-}_{2.96}$ composition, the ratio of Mn and O ions varies as follows: $O^{2-}(2.96)$; $Mn^{3+}((1-x)+8\%)$; and, $Mn^{4+}(x-8\%)$. In another aspect, the method creates a density in the PCMO film, responsive to the crystallographic orientation. For example, if the PCMO film has a (110) orientation, a density is created in the range of 5 to 6.76 Mn atoms per 100 Å² in a plane perpendicular to the (110) orientation.

6 Claims, 14 Drawing Sheets

Fig. 3
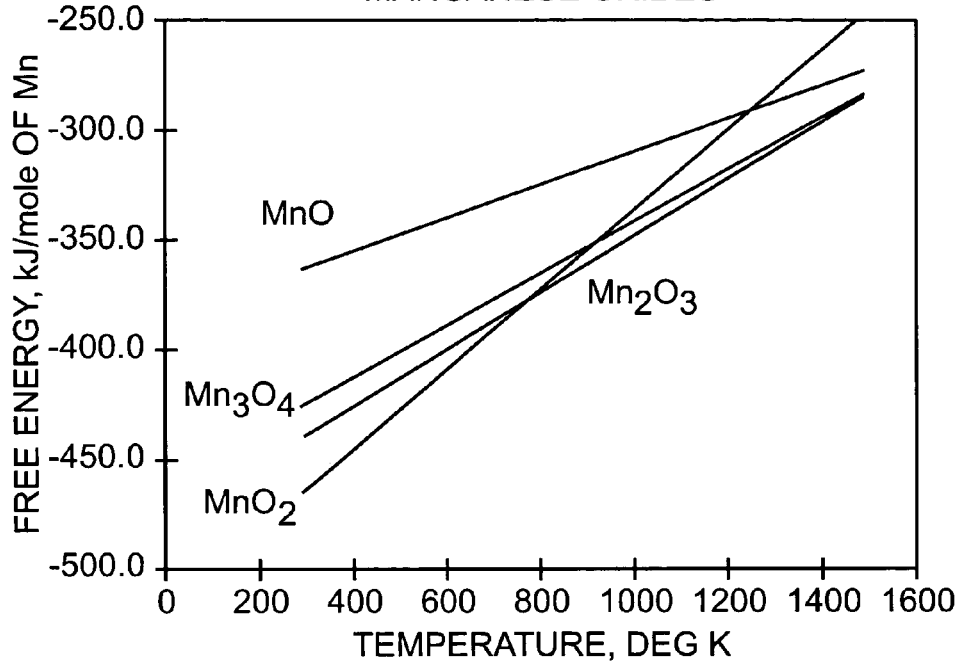
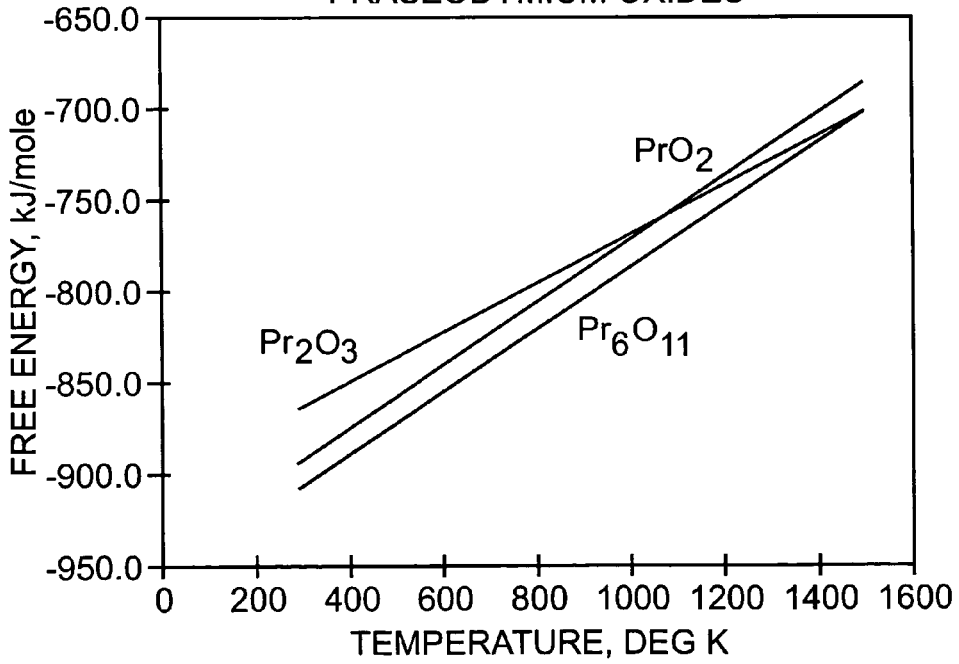

THE ELECTRON JUMPS
INTO OXYGEN VACANCY

THE ELECTRON JUMPS
BACK TO $Mn^{3+}$ ION

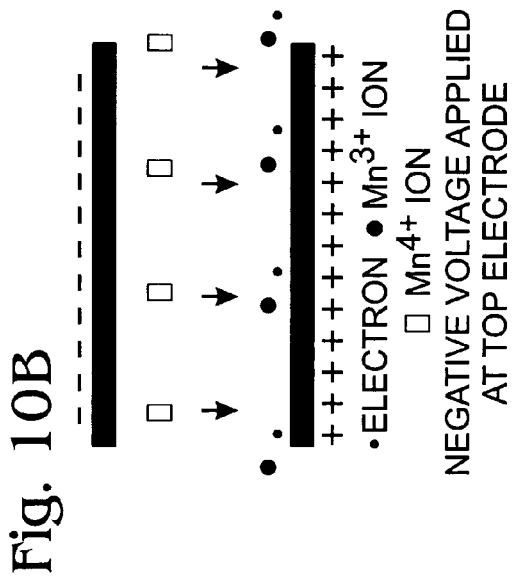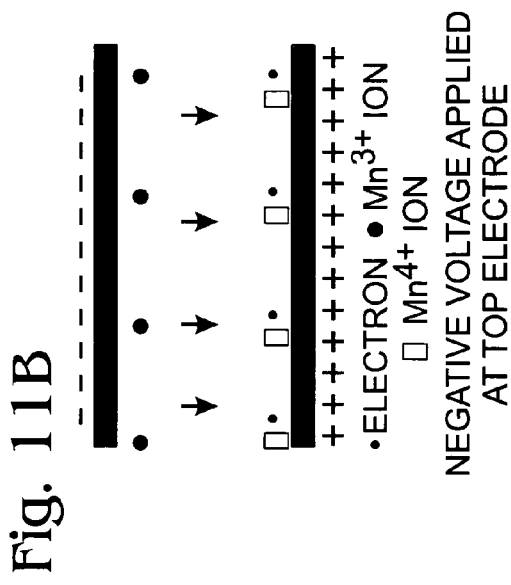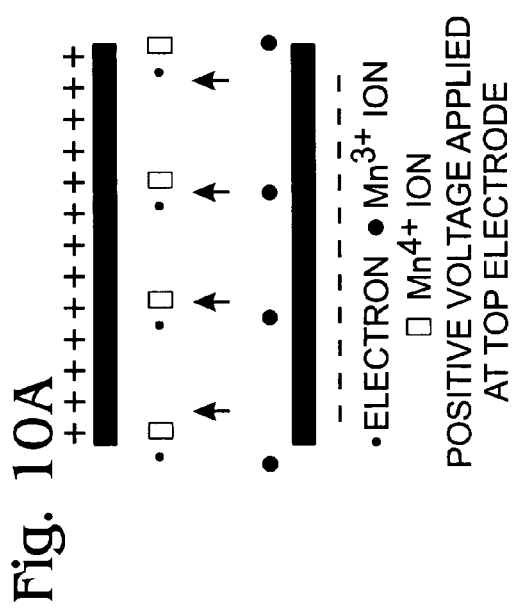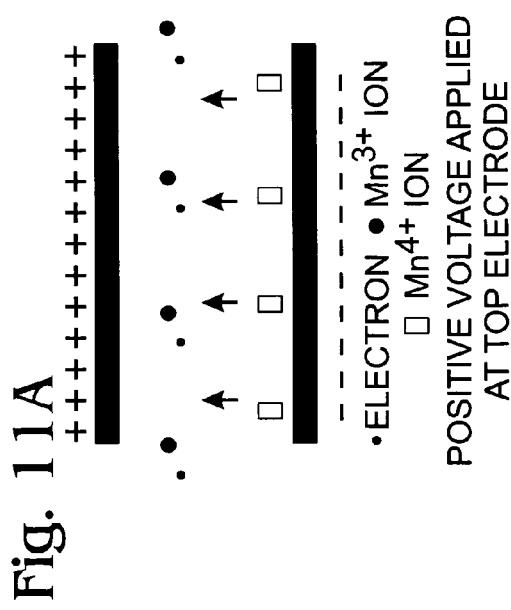

(Pr0.7, Ca0.3)MnO3

(Pr0.7, Ca0.3)MnO3

PCMO THIN FILM WITH RESISTANCE RANDOM ACCESS MEMORY (RRAM) CHARACTERISTICS

BACKGROUND OF THE INVENTION

1. Field of the Invention

This invention generally relates to integrated circuit (IC) memory fabrication and, more particularly, to a $Pr_xCa_{1-x}MnO_3$ (PCMO) memory film and associated film process.

2. Description of the Related Art

In order to meet the requirements of low power, low operation voltage, high-speed, and high-density memory applications, electrically alterable resistors are being investigated that can be fabricated from PCMO. Metalorganic chemical vapor deposition (MOCVD), sputtering, laser ablation, and metalorganic deposition (MOD) methods can be used, along with appropriate surface treatments, to deposit PCMO on various substrates. The different deposition methods are being investigated to address the control of specific interfacial properties of the PCMO, such as lattice mismatch, trapped charge density, as well as bulk properties such as grain size and film. Reversible and non-volatile resistance changes in the PCMO film are desirable using either bipolar or unipolar pulsed biasing. Therefore, an understanding the relationship between memory characteristics and PCMO thin film material structure is sought. PCMO also exhibits colossal magnetoresistive (CMR) properties. These are also strongly affected by thin film crystal structure. An understanding of the relationship between crystal structure and an electrically alterable resistance suitable for RRAM devices is desired.

It would be advantageous if the memory resistance characteristics of a PCMO film could be controlled and optimized by the judicious choice of crystallization and orientation of PCMO thin films.

SUMMARY OF THE INVENTION

The present invention describes processes for forming PCMO resistance-memory characteristics that are responsive to controllable deposition attributes such as film composition, structure, and crystallographic orientation.

Accordingly, a method is provided for forming a PrCaMnO (PCMO) thin film with predetermined memory-resistance characteristics. In one aspect the method comprises: forming a $Pr^{3+}_{1-x}Ca^{2+}_xMnO$ thin film composition, where $0.1<x<0.6$; in response to the selection of x, varying the ratio of Mn and O ions as follows:

$O^{2-}(3\pm20\%)$;
$Mn^{3+}((1-x)\pm20\%)$; and,
$Mn^{4+}(x\pm20\%)$.

For example, when the PCMO thin film has a $Pr^{3+}0.70Ca^{2+}0.30Mn^{3+}_{0.78}Mn^{4+}_{0.22}O^{2-}_{2.96}$ composition, the ratio of Mn and O ions varies as follows:

$O^{2-}(2.96)$;
$Mn^{3+}((1-x)+8\%)$; and,
$Mn^{4+}(x-8\%)$.

In another aspect, the method comprises forming a PCMO thin film with a crystallographic orientation; and, creating a density in the PCMO film, responsive to the orientation. For example, if the PCMO film has a (110) orientation, a density is created in the range of 5 to 6.76 Mn atoms per 100 Å$^2$ in a plane perpendicular to the (110) orientation.

In another aspect, the method comprises: forming a bottom electrode; forming a PCMO thin film with a crystallographic orientation overlying the bottom electrode; and, creating a lattice mismatch in the PCMO film, responsive to the orientation, between the PCMO thin film and the bottom electrode. For example, if the PCMO film has a (110) orientation, then a lattice mismatch of less than 30% is created between the PCMO thin film and the bottom electrode.

In a different aspect, the method comprises: forming a PCMO thin film with a crystallographic orientation; and, creating a PCMO film with a selectable resistance state, responsive to the orientation. For example, if the PCMO film has a (001) orientation, then the PCMO film resistance state can be written to a high resistance in the range of 10 to 1000 kilo ohms, using $\pm(2$ to $10)$ volt (V) pulse, with a duration in the range of 5 nanosecond (ns) to 50 microseconds. Further, the (001) PCMO can be reset to a low resistance in the range of 500 ohms to 10 kilo ohms, using $\pm(2$ to $10)$ V pulse, with a duration in the range of 5 ns to 50 microseconds.

In another aspect, the method comprises: forming a PCMO thin film with a crystal grain size; and, creating a PCMO film with a selectable resistance state, responsive to the grain size. For example, if the PCMO film is formed with an average crystal grain size in the range of 3 to 40 nanometers (nm), then the PCMO film can be written to a high resistance of greater than 225 kilo ohms, using 5 V pulse of less than 100 ns, or reset to a low resistance of less than 10 kilo ohms, using a 3 V pulse of less than 10 microseconds.

In one aspect, the method comprises creating a super lattice structure with an ordered distribution in the PCMO film, responsive to the PCMO film composition. For example, if the PCMO thin film has a $Pr^{3+}_{0.50}Ca^{2+}_{0.50}MnO_{0.3}$ composition, then a distribution is created as follows:

$Z(Mn^{3+})PrMnO_3$: $Z(Mn^{4+})CaMnO_3$ subunits, where Z is a natural number.

Additional details of the above-described methods, and a PCMO device with memory characteristics responsive to film attributes such as composition, structure, and crystallographic orientation, are presented below.

BRIEF DESCRIPTION OF THE DRAWINGS

FIG. 3 is a drawing depicting the Gibbs free energies for the formation of Pr and Mn oxides.

FIGS. 10A and 10B are drawings showing the directionality of electron jumps between $Mn^{3+}$ and $Mn^{4+}$ ions.

FIG. 11A and 11B show electron flow when the PrMnO$_3$ and CaMnO$_3$ subunit layers are reversed with respect to the bottom electrode.

DETAILED DESCRIPTION OF THE PREFERRED EMBODIMENTS

Some general relationships between PCMO physical attributes, responsive to deposition procedures, and resistance-memory characteristics will be initially presented. Detailed analysis of these general relationships is presented below in the Functional Description Section of the application.

The first aspect of the present invention should be considered with respect to FIGS. 4A, 4B, and Table 1, below. A PrCaMnO (PCMO) thin film with predetermined memory-resistance characteristics comprises a Pr$^{3+}_{1-x}$Ca$^{2+}_{x}$MnO composition, where 0.1<x<0.6; and, a ratio of Mn and O ions is responsive to the composition as follows:

O$^{2-}$(3±20%);
Mn$^{3+}$((1−x)±20%); and,
Mn$^{4+}$(x±20%).

When the composition is Pr$^{3+}_{0.70}$Ca$^{2+}_{0.30}$Mn$^{3+}_{0.78}$Mn$^{4+}_{0.22}$O$^{2-}_{2.96}$, then the ratio of Mn and O ions is as follows:

O$^{2-}$(2.96);
Mn$^{3+}$((1−x)+8%); and,
Mn$^{4+}$(x−8%).

Further, the PCMO film has a 13.3% oxygen vacancy.

Figure 12A:
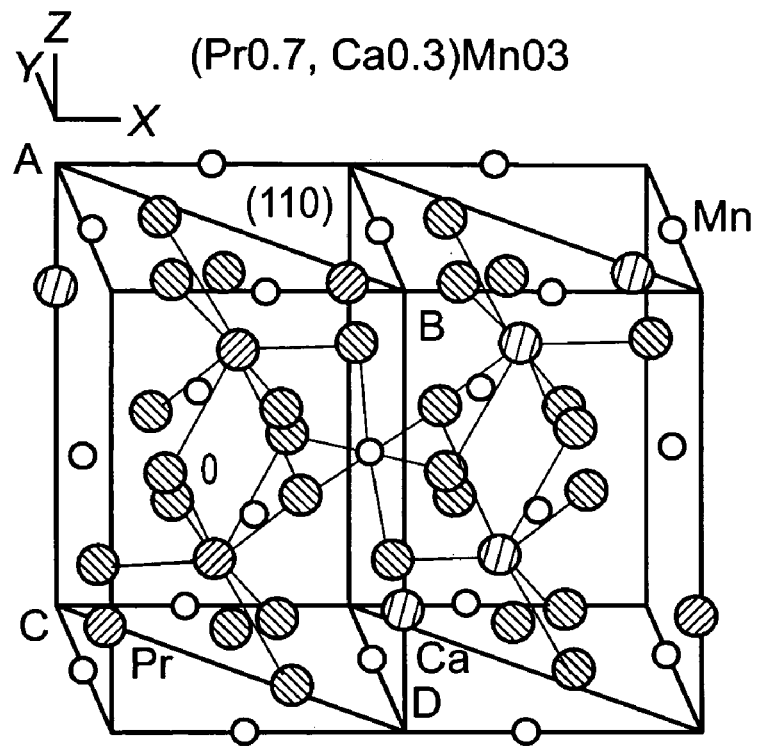
FIGS. 12A, 12B, 12C depict the (110), (011), and (101) orientations, respectively, of PCMO thin films.
Figure 12B:
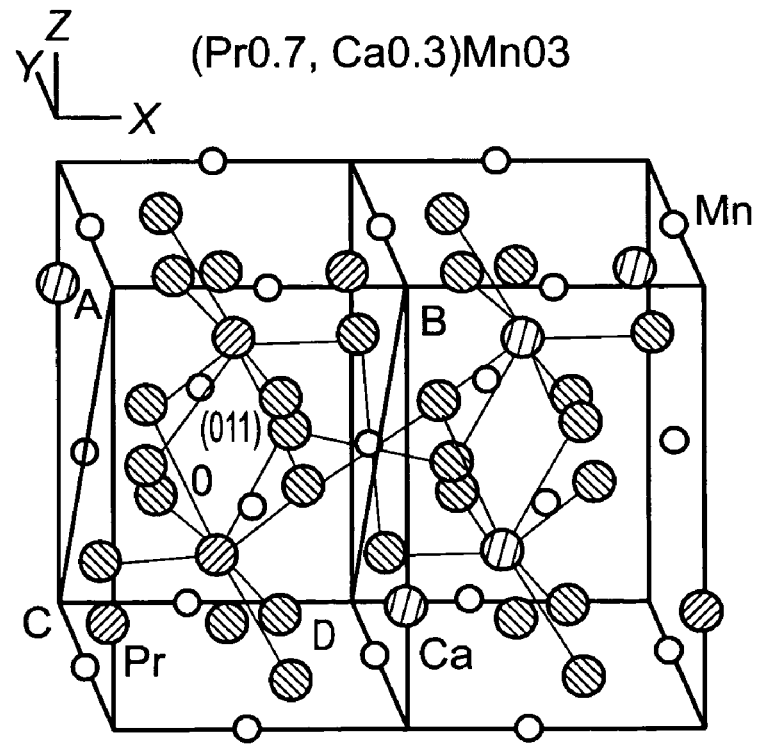
Figure 12C:
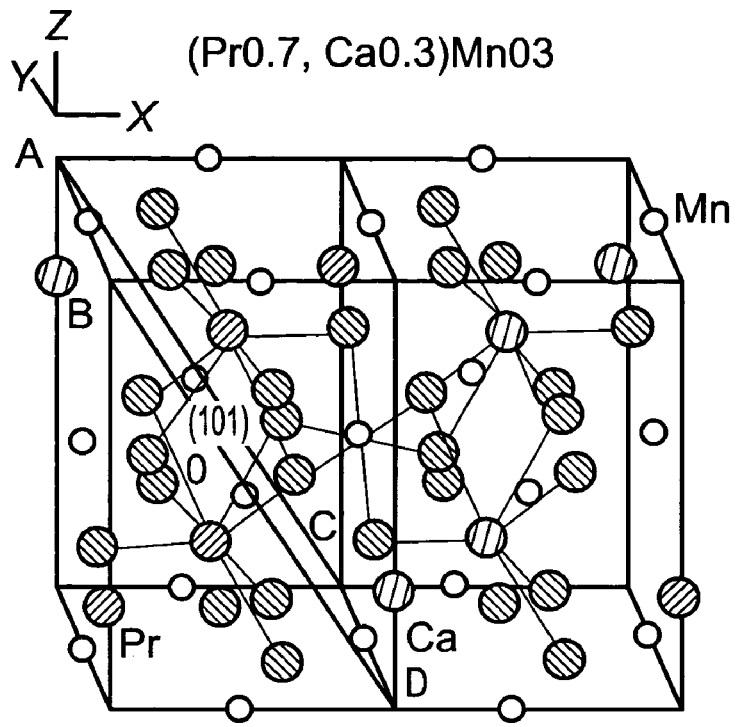

In a second aspect of the invention, considered with respect to Table 1 and FIGS. 12A–12C, a Pr$^{3+}_{1-x}$Ca$^{2+}_{x}$Mn$^{3+}_{(1-x)\pm20\%}$Mn$^{4+}_{x\pm20\%}$O$^{2-}_{3\pm20\%}$ (PCMO) thin film comprises a crystallographic orientation, and a density responsive to the orientation. When the crystallographic orientation is a (110) orientation, the density is in the range of 5 to 6.76 Mn atoms per 100 Å$^2$ in a plane perpendicular to the (110) orientation (the <110>). Further, a distance of 3.855 Å exists between closest (the two closest) Mn atoms, responsive to the (110) orientation.

When the crystallographic orientation is in a (001) orientation, the density is in the range of 5 to 6.73 Mn atoms per 100 Å$^2$ in a plane perpendicular to the (001) orientation, and a distance of 3.840 Å exists between the two closest Mn atoms, responsive to the (001) orientation.

Figure 21:
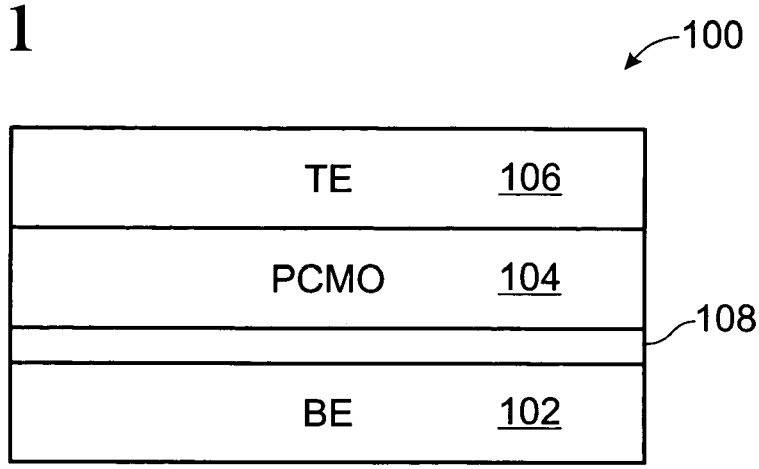
FIG. 21 is a partial cross-sectional view of the present invention Pr$^{3+}_{1-x}$Ca$^{2+}_{x}$Mn$^{3+}_{(1-x)\pm20\%}$Mn$^{4+}_{x\pm20\%}$O$^{2-}_{3\pm20\%}$ (PCMO) thin film memory-resistance device.

FIG. 21 is a partial cross-sectional view of the present invention Pr$^{3+}_{1-x}$Ca$^{2+}_{x}$Mn$^{3+}_{(1-x)\pm20\%}$Mn$^{4+}_{x\pm20\%}$O$^{2-}_{3\pm20\%}$ (PCMO) thin film memory-resistance device. The device 100 comprises a bottom electrode (BE) 102, a PCMO thin film 104 overlying the bottom electrode 102, and a top electrode (TE) 106. The bottom electrode 102 can be a material such as Pt, Ir, Al, or TiN. In some aspects, a buffer layer 108 is interposed between the PCMO thin film 104 and the bottom electrode 102 formed from a material such as InO$_3$ or ZnO.

The PCMO thin film 104 has a crystallographic orientation, and a lattice mismatch between the PCMO thin film 104 and the bottom electrode 102 (or buffer layer 108), responsive to the crystallographic orientation. When the PCMO thin film 104 has a (110) orientation, then the lattice mismatch of less than 30%. Likewise, when the PCMO thin film 104 has a (001) orientation, the lattice mismatch is less than 30%.

In a different aspect (see FIGS. 18 and 20), the Pr$^{3+}_{1-x}$Ca$^{2+}_{x}$Mn$^{3+}_{(1-x)\pm20\%}$Mn$^{4+}_{x\pm20\%}$O$^{2-}_{3\pm20\%}$ (PCMO) thin film has a crystallographic orientation and a selectable resistance state, responsive to the crystallographic orientation. When the crystallographic orientation is in a (001) orientation, the selectable resistance state is a high resistance in the range of 10 to 1000 kilo ohms, using ±(2 to 10) volt (V) pulse, with a duration in the range of 5 nanosecond (ns) to 50 microseconds, or a low resistance in the range of 500 ohms to 10 kilo ohms, using ±(2 to 10) V pulse, with a duration in the range of 5 ns to 50 microseconds.

If the PCMO crystallographic orientation is in a (110) orientation, the selectable resistance state is a high resistance in the range of 10 to 1000 kilo ohms, using ±(2 to 10) V pulse, with a duration in the range of 5 ns to 50 microseconds, or a low resistance in the range of 500 ohms to 10 kilo ohms, using ±(2 to 10) V pulse, with a duration in the range of 5 ns to 50 microseconds.

Figure 19:
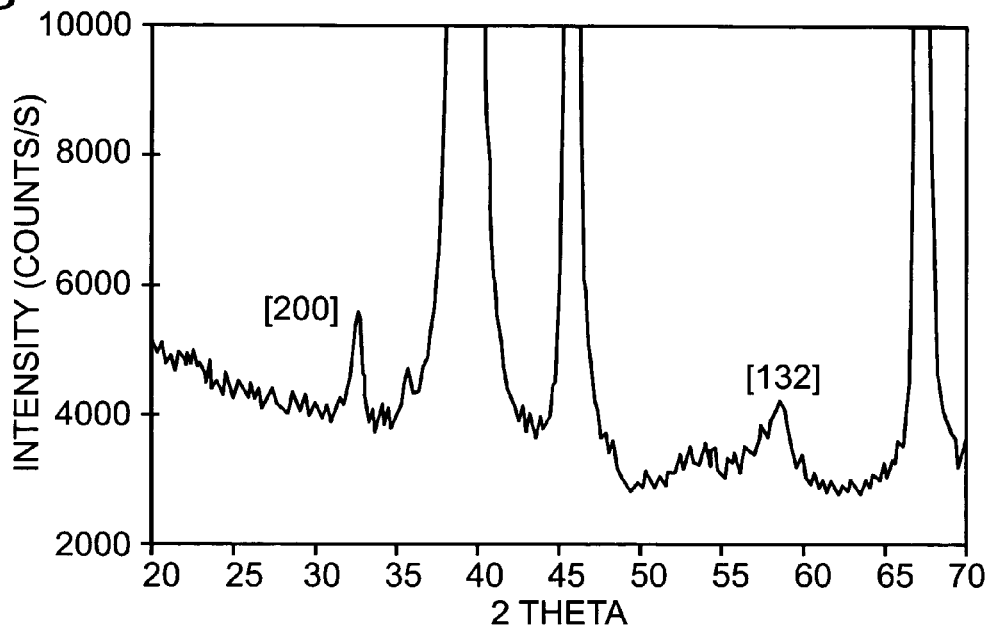
FIG. 19 shows the x-ray pattern of a PCMO thin film with nanosized polycrystalline materials.
Figure 20:
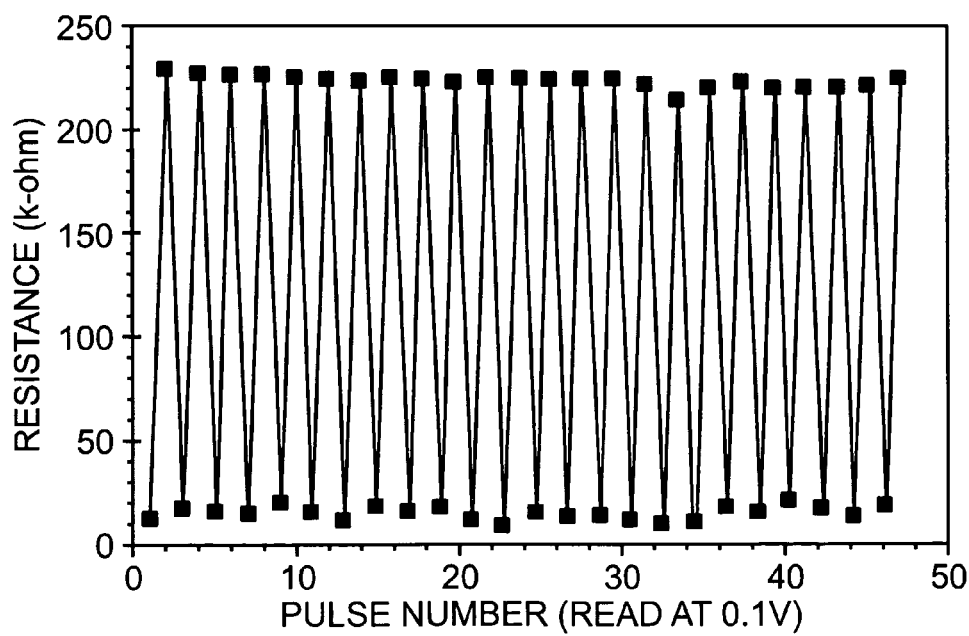
FIG. 20 depicts the unipolar switching properties of the PCMO thin film of FIG. 19.

In another aspect, see FIGS. 19 and 20, the Pr$^{3+}_{1-x}$Ca$^{2+}_{x}$Mn$^{3+}_{(1-x)\pm20\%}$Mn$^{4+}_{x\pm20\%}$O$^{2-}_{3\pm20\%}$ (PCMO) thin film comprises a crystal grain size, and a selectable resistance state, responsive to the grain size. If the crystal grain size is in the range of 3 to 40 nanometers (nm), then the selectable resistance state is a high resistance of greater than 225 kilo ohms, using 5 V pulse of less than 100 ns, or a low resistance of less than 10 kilo ohms, using a 3 V pulse of less than 10 microseconds.

If the crystal grain size in the range of 40 nm to epitaxial, then the selectable resistance state can be a high resistance of greater than 300 kilo ohms, using −5 V pulse of less than 50 microseconds, or a low resistance of less than 10 kilo ohms, using a +5 V pulse of less than 50 microseconds.

Figure 7:
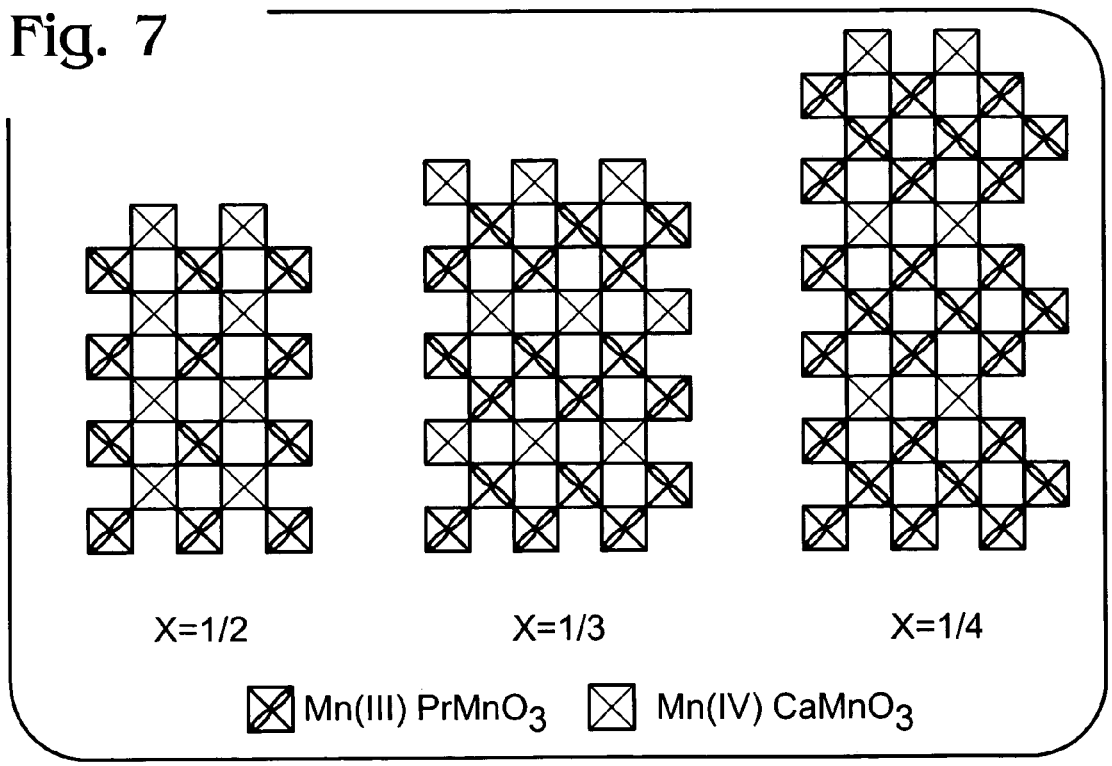
FIG. 7 is a diagram depicting the distribution of $PrMnO_3$ and $CaMnO_3$ subunits, as a function of x, in $Pr_{1-x}Ca_xMnO_3$ materials.

In another aspect, see FIG. 7, a Pr$^{3+}_{1-x}$Ca$^{2+}_{x}$Mn$^{3+}_{(1-x)\pm20\%}$Mn$^{4+}_{x\pm20\%}$O$^{2-}_{3\pm20\%}$ (PCMO) thin film comprises a composition, and a super lattice structure of with an ordered distribution, responsive to the composition. For example, if the composition is Pr$^{3+}_{0.50}$Ca$^{2+}_{0.50}$MnO$_{0.3}$, then the super lattice structure ordered distribution is:

Z(Mn$^{3+}$)PrMnO$_3$:Z(Mn$^{4+}$)CaMnO$_3$ subunits, where Z is a natural number.

If the composition is Pr$^{3+}_{0.67}$Ca$^{2+}_{0.33}$MnO$_{0.3}$, then the super lattice structure ordered distribution is:

2Z(Mn$^{3+}$)PrMnO$_3$:Z(Mn$^{4+}$)CaMnO$_3$ subunits, where Z is a natural number.

If the composition is Pr$^{3+}_{0.75}$Ca$^{2+}_{0.25}$MnO$_{0.3}$, then the super lattice structure of ordered distribution is:

$3Z(Mn^{3+})PrMnO_3:Z(Mn^{4+})CaMnO_3$ subunits, where Z is a natural number.

Functional Description

Figure 1:
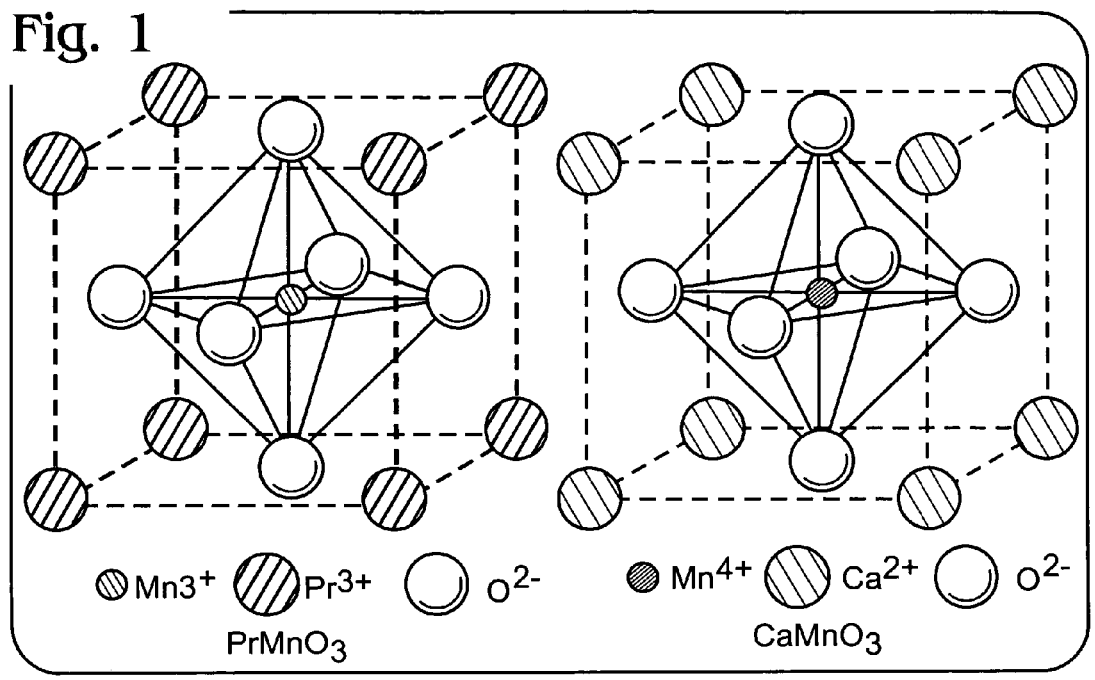
FIG. 1 is a drawing illustrating perovskite cubic structures.

FIG. 1 is a drawing illustrating perovskite cubic structures. $Pr_{1-x}Ca_xMnO_3$ is an electrically alterable resistive material whose memory resistance characteristics are related to the PCMO lattice structure. The unit cell of $Pr_{1-x}Ca_xMnO_3$ consist of two subunits units: $PrMnO_3$ and $CaMnO_3$. The ideal lattice of each unit has the same perovskite cubic structure, as shown in the figure.

In the case of the $Pr_{1-x}Ca_xMnO_3$ series, the end members $PrMnO_3$ and $CaMnO_3$ have an orthorhombic structure belonging to the same space group Pbnm, but the distortion of the latter is almost negligible so that its structure may be regarded as quasicubic. The change of the lattice parameters when passing from x=0 to x=1 is, however, not monotonic and exhibits some anomalies. Similar peculiarities, though different in detail, seem to exist in other rare earth manganese perovskites. Further, both $PrMnO_3$ and $CaMnO_3$ are antiferromagnetically ordered and insulating at low temperatures (types Ay and G, respectively). But in the range of 0<x<0.4 a spontaneous ferromagnetic moment appears that has been ascribed to the strong double exchange interactions $Mn^{3+}$—$O^{2-}$—$Mn^{4+}$, which results in a material transformation from (Mott) insulator to metallic conductor.

Figure 2:
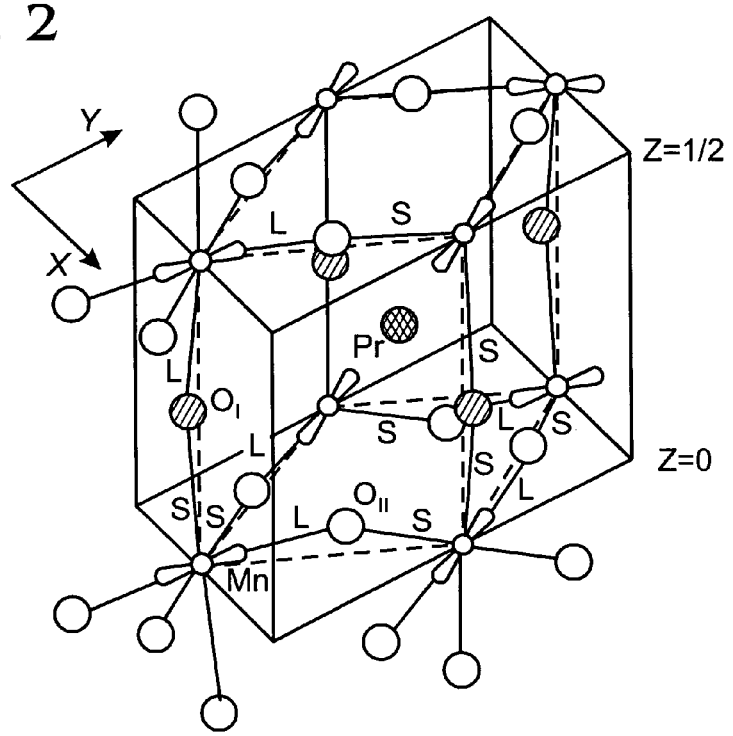
FIG. 2 is a drawing illustrating the $PrMnO_3$ lattice structure.

FIG. 2 is a drawing illustrating the $PrMnO_3$ lattice structure. $PrMnO_3$ units have $Pr^{3+}$ and $Mn^{3+}$ ions. The deviations of $Mn$—$O_I$—$Mn$ and $Mn$—$O_{II}$—$Mn$ angles from 180° (which is the angle in ideal cubic perovskites) manifest the buckling and are the cause of the lattice distortion (especially the elongation of the b axis) in orthorhombic perovskites. The increase of the b parameter is markedly enhanced in $PrMnO_3$ and other samples with high $Mn^{3+}$ content due to the $e_g$ orbital ordering shown in FIG. 2.

FIG. 3 is a drawing depicting the Gibbs free energies for the formation of Pr and Mn oxides. According to simple calculations of the Gibbs free energy of oxides, both $Mn^{3+}$ and $Mn^{4+}$ and $Pr^{3+}$ and $Pr^{4+}$ are stable at room temperature, as shown. In $PrMnO_3$ units, the $Pr^{3+}$ and $Mn^{3+}$ ions are stable. $PrMnO_3$ are antiferromagnetically ordered and insulating at low temperatures. Under certain conditions, such as those existing with $CaMnO_3$, or with oxygen vacancies in $PrMnO_3$ units, the bond gap of the $PrMnO_3$ material decreases. Then, the $Mn^{3+}$ ion can lose a free electron and change to $Mn^{4+}$ as shown in equation 1.

$$Mn^{3+} \rightarrow Mn^{4+} + e^- \tag{1}$$

Because the $Mn^{3+}$ in $PrMnO_3$, and $Mn^{4+}$ in $CaMnO_3$ subunits have almost the same octahedral cage formed by oxygen ions enclosing Mn ions, double exchange interactions $Mn^{3+}$—$O^{2-}$—$Mn^{4+}$ may occur. Oxygen vacancies further enhance the double exchange interactions $Mn^{3+}$—$O^{2-}$—$Mn^{4+}$. Therefore, doping Ca into $PrMnO_3$ to form PCMO, in particular $Pr_{1-x}Ca_xMnO_3$ (0<x<0.4), results in an electrically conductive material. Moreover, the $CaMnO_3$ subunit formed in the cubic perovskite $ABX_3$ structure has a lattice constant of 3.73 Å. Mn ions are sixfold coordinated with oxygen ions along the Cartesian axis, while Ca ions are twelvefold coordinated with oxygen ions lying along its (110) directions. Six oxygen ions form an octahedral cage for the Mn ions, and the cage is linked by oxygen ions. Naturally, the $CaMnO_3$ subunits have $Ca^{2+}$ and $Mn^{4+}$ ions. Because of the strong electronegativity of oxygen, essentially no electrons are available to transform an $Mn^{4+}$ ion into an $Mn^{3+}$ within these subunits. $CaMnO_3$ has a large band gap and bulk $CaMnO_3$ is found to be an insulator. On the other hand, due to formation of defects such as oxygen vacancies, the band gap of $CaMnO_3$ may be reduced, in which case the $Mn^{4+}$ ion may accept an electron to form $Mn^{3+}$ in these subunits as shown in equation 2.

$$Mn^{4+} + e^- \rightarrow Mn^{3+} \tag{2}$$

In this way, $Mn^{3+}$ ions may form within $CaMnO_3$ subunits with oxygen vacancies, as shown in equation 3.

$$CaMnO_3 \rightarrow 2[Mn^{3+}]'_{[Mn^{4+}]} + O_o + V_o^{\cdot\cdot} \tag{3}$$

Figure 4A:
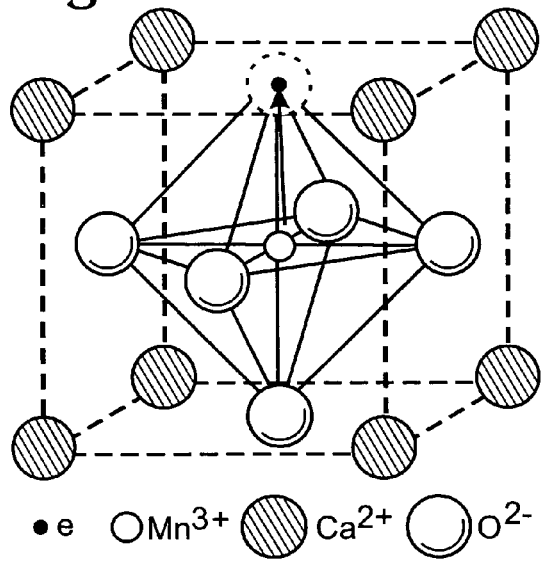
FIGS. 4A and 4B are drawings illustrating the mechanism of reversible resistive switching properties in a $CaMnO_3$ unit.
Figure 4B:
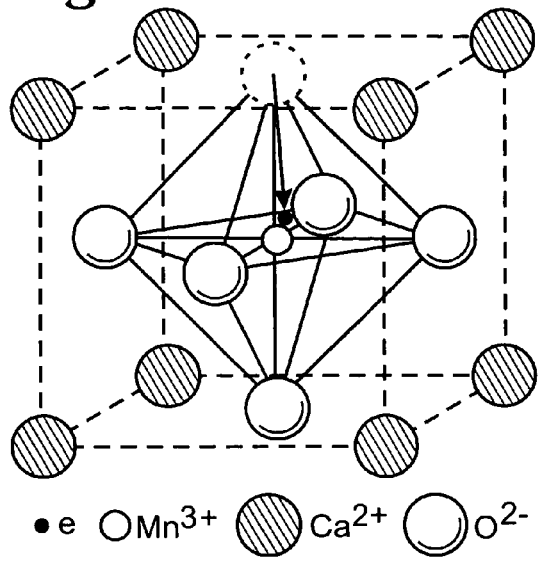

FIGS. 4A and 4B are drawings illustrating the mechanism of reversible resistive switching properties in a $CaMnO_3$ unit. If the valence electrons of the $Mn^{3+}$ ions in $Mn^{4+}$ positions get energy, by any means such as thermal or electrical energy, the electrons can jump to oxygen vacancies or jump back to the $Mn^{3+}$ ions in $Mn^{4+}$ positions. On the other hand, when $PrMnO_3$ units exist in $CaMnO_3$ material, the valence electrons of the $Mn^{3+}$ ions in $PrMnO_3$ units that get energy (thermal, electrical energy, etc.), can jump to $Mn^{4+}$ ions in $CaMnO_3$ units, or jump back to the $Mn^{3+}$ ions in $CaMnO_3$ units, which is the double exchange interaction $Mn^{3+}$—$O^{2-}$—$Mn^{4+}$. Oxygen vacancies provide the space for the double exchange interactions $Mn^{3+}$—$O^{2-}$—$Mn^{4+}$. In this way, $Pr_{1-x}Ca_xMnO_3$ materials can have both lower resistance and higher resistance states. In the state where electrons jump into oxygen vacancies or the $Mn^{4+}$ position in $CaMnO_4$ units (FIG. 4A), a lower resistance results. In the state where electrons jump back to $Mn^{3+}$ ions, a higher resistance results, as shown in FIG. 4B.

For $Pr_{1-x}Ca_xMnO_3$ (0<x<1) materials, the lattice constants, orthorhombic distortion D, and the valence distribution are shown in Table 1, cross-referenced to an increasing value of x (increasing $CaMnO_3$ subunits to PCMO). From Table 1, it follows that when x=0.3 or 0.6, PCMO materials have a maximum concentration of $Mn^{3+}$ ions (8%) in $CaMnO_3$ subunits and oxygen vacancies (4%).

The room temperature lattice constants, orthorhombic distortion D, and the valance distribution in the $Pr_{1-x}Ca_xMnO_3$ materials

TABLE 1

| x | a Å | b Å | c Å | D (%) | Valence distribution | |
|---|---|---|---|---|---|---|
| 0 | | | | | $Pr^{3+}_{0.994}Mn^{3+}_{0.958}Mn^{4+}_{0.036}O^{2-}_3$ | (4) |
| 0.1 | 5.442 | 5.617 | 7.635 | 1.59 | $Pr^{3+}_{0.89}Ca^{2+}_{0.11}Mn^{3+}_{0.91}Mn^{4+}_{0.09}O^{2-}_{2.985}$ | (3) |
| 0.2 | 5.442 | 5.552 | 7.657 | 1.01 | $Pr^{3+}_{0.80}Ca^{2+}_{0.2}Mn^{3+}_{0.81}Mn^{4+}_{0.19}O^{2-}_{2.995}$ | (3) |
| 0.3 | 5.426 | 5.478 | 7.679 | 0.41 | $Pr^{3+}_{0.70}Ca^{2+}_{0.30}Mn^{3+}_{0.78}Mn^{4+}_{0.22}O^{2-}_{2.96}$ | (3) |
| 0.4 | 5.415 | 5.438 | 7.664 | 0.17 | $Pr^{3+}_{0.60}Ca^{2+}_{0.40}Mn^{3+}_{0.64}Mn^{4+}_{0.36}O^{2-}_{2.98}$ | (3) |
| 0.5 | 5.395 | 5.403 | 7.612 | 0.14 | $Pr^{3+}_{0.50}Ca^{2+}_{0.50}Mn^{3+}_{0.55}Mn^{4+}_{0.45}O^{2-}_{2.975}$ | (3) |
| 0.6 | 5.375 | 5.375 | 7.60 | — | $Pr^{3+}_{0.40}Ca^{2+}_{0.60}Mn^{3+}_{0.48}Mn^{4+}_{0.52}O^{2-}_{2.96}$ | (3) |
| 0.7 | 5.349 | 5.349 | 7.543 | — | $Pr^{3+}_{0.30}Ca^{2+}_{0.70}Mn^{3+}_{0.33}Mn^{4+}_{0.67}O^{2-}_{2.985}$ | (3) |
| 0.8 | 5.318 | 5.318 | 7.521 | — | $Pr^{3+}_{0.20}Ca^{2+}_{0.80}Mn^{3+}_{0.25}Mn^{4+}_{0.75}O^{2-}_{2.97}$ | (3) |

TABLE 1-continued

| x | a Å) | b Å) | c Å) | D (%) | Valence distribution | |
|---|---|---|---|---|---|---|
| 0.9 | 5.300 | 5.300 | 7.495 | — | $Pr^{3+}_{0.10}Ca^{2+}_{0.90}Mn^{3+}_{0.23}Mn^{4+}_{0.77}O^{2-}_{2.93}$ | (3) |
| 1 | | | | | $Ca^{2+}Mn^{3+}_{0.16}Mn^{4+}_{0.84}O^{2-}_{2.92}$ | (4) |

Figure 5:
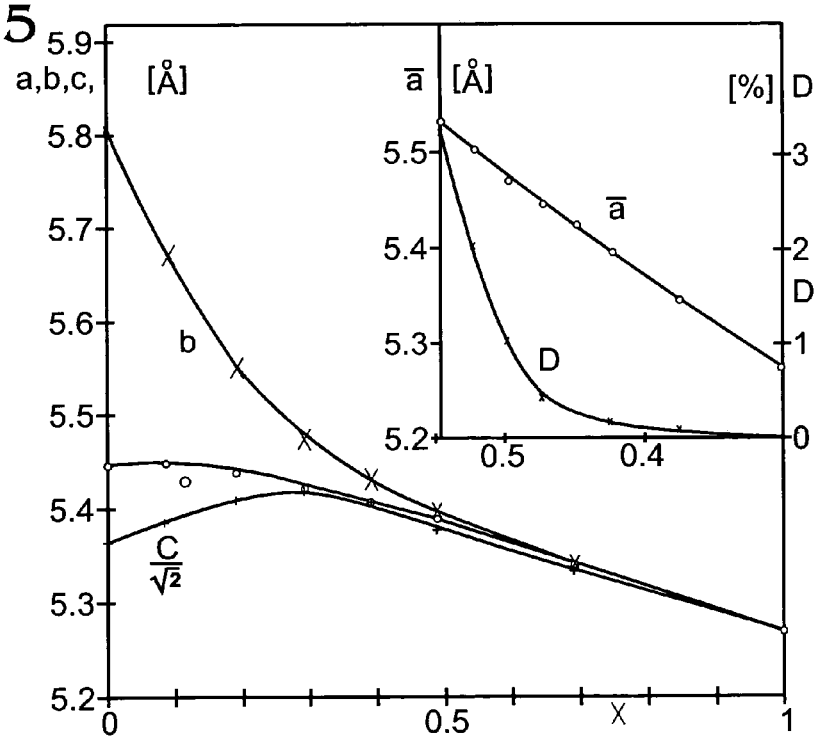
FIG. 5 is a drawing depicting the relationship between composition and lattice structures of $Pr_{1-x}Ca_xMnO_3$.

FIG. 5 is a drawing depicting the relationship between composition and lattice structures of $Pr_{1-x}Ca_xMnO_3$. Due to the absence of double exchange interactions: $Mn^{3+}$—$O^{2-}$—$Mn^{4+}$, for x=0.6, a composition of $Pr_{1-x}Ca_xMnO_3$ with x=0.3 may be the best candidate material for an RRAM device in some applications. From the figure, in the composition range 0<x<0.4, $Pr_{1-x}Ca_xMnO_3$ materials exhibit a larger lattice distortion. In contrast, for x>0.4, a smaller lattice distortion can be found.

Next, the mechanism of reversible resistive switching properties in a PCMO material is described. Based on above analysis, the electrically alterable resistive properties of PCMO materials may come from electron traps and double exchange interactions: $Mn^{3+}$—$O^{2-}$—$Mn^{4+}$.

The Case of $Pr_{0.7}Ca_{0.3}MnO_3$

Figure 6:
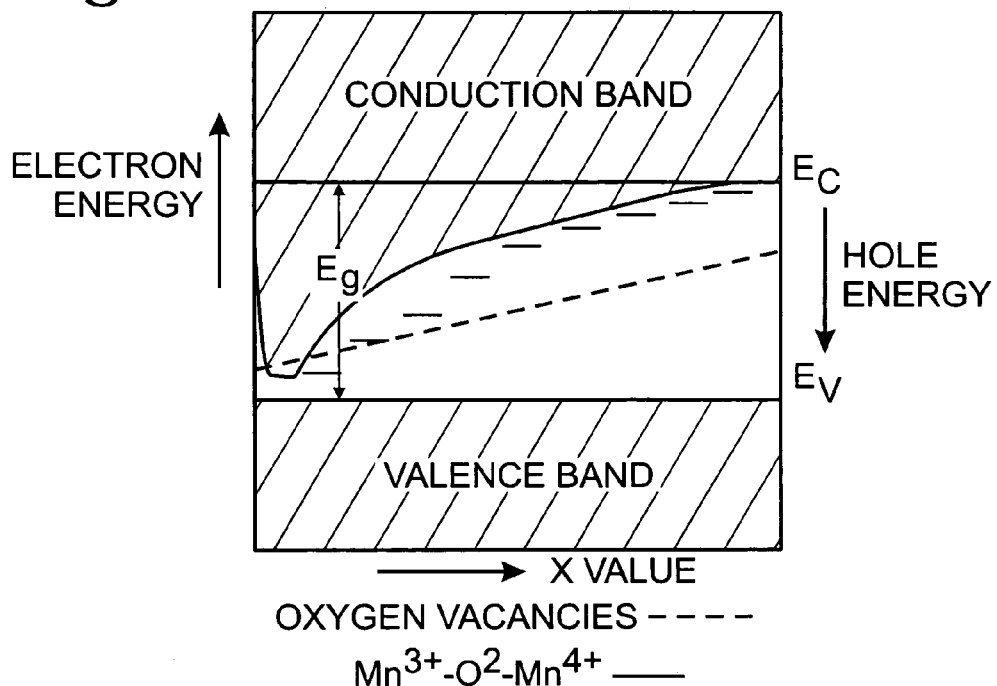
FIG. 6 is a drawing depicting the band gap as a function of x value and oxygen vacancies.

FIG. 6 is a drawing depicting the band gap as a function of x value and oxygen vacancies. According to experimental data, $Pr_{0.7}Ca_{0.3}MnO_3$ has a maximum concentration of $Mn^{3+}$ ions (8%) in $CaMnO_3$ subunits and oxygen vacancies (4%), as summarized in Table 1. Moreover, the composition of $Pr_{0.7}Ca_{0.3}MnO_3$ is located at the boundary between larger and smaller orthorhombic distortion, D, as x is varied in $Pr_{1-x}Ca_xMnO_3$. In PCMO materials, in the composition range 0<x<0.4, the materials are known to have lower resistance. Conversely, for x>0.4, PCMO materials have higher resistance. Similarly, $Pr_{0.7}Ca_{0.3}MnO_3$ is also located at the boundary between higher and lower resistance materials. From the characteristics of $Pr_{0.7}Ca_{0.3}MnO_3$ materials, it can be concluded that for x>0.4, the band gap of PCMO materials is so large that it is difficult to electrically alter the material resistance. Conversely, in the composition range 0<x<0.2, PCMO materials are leaky or conductive.

In the composition range 0.2<x<0.4, the resistance of the material becomes metastable, which allows electrical alteration of the resistance. Also, a pulsed electric field can cause electrons to jump into oxygen vacancies, or to transfer from $Mn^{3+}$ to $Mn^{4+}$. In this case, the resistance of PCMO increases. Conversely, if in a pulsed electrical field, electrons transfer back from oxygen vacancies to $Mn^{3+}$, or from $Mn^{4+}$ back into $Mn^{3+}$, then the resistance of PCMO decreases. Therefore, electrical alteration of the resistance in PCMO may be caused by electron trapping in oxygen vacancies and double exchange interactions: $Mn^{3+}$—$O^{2-}$—$Mn^{4+}$. In addition, as temperature is increased, thermally excited electrons may transfer into oxygen vacancies or make double exchange interactions $Mn^{3+}$—$O^{2-}$—$Mn^{4+}$. Thus, the resistance of PCMO materials decreases as a function of increasing temperature, as is observed.

FIG. 7 is a diagram depicting the distribution of $PrMnO_3$ and $CaMnO_3$ subunits, as a function of x, in $Pr_{1-x}Ca_xMnO_3$ materials. In PCMO for any value of x, there are ordered distributions of $PrMnO_3$ and $CaMnO_3$ subunits. $PrMnO_3$ and $CaMnO_3$ subunits are separately grown layer-by-layer depending on the ratio of $PrMnO_3$ to $CaMnO_3$. For x=½, $PrMnO_3$ subunits alternate with $CaMnO_3$ subunits. For $Pr_{0.7}Ca_{0.3}MnO_3$ materials, which is close to x=⅓, typically two $PrMnO_3$ subunit layers are separated by one $CaMnO_3$ subunit layer. Likewise, for x=¼, three $PrMnO_3$ subunit layers are separated by one $CaMnO_3$ subunit layer. Because $CaMnO_3$ subunits have $Mn^{3+}$ ions and oxygen vacancies, a double exchange interactions: $Mn^{3+}$—$O^{2-}$—$Mn^{4+}$ may occur between of $PrMnO_3$ and $CaMnO_3$ subunits. $Pr_{0.7}Ca_{0.3}MnO_3$ may be changed by an applied electric field from an insulator to a conductor, or vice versa. Therefore, these materials exhibit a non-volatile, electrically alterable resistance.

Oxygen Vacancies

Figure 8A:
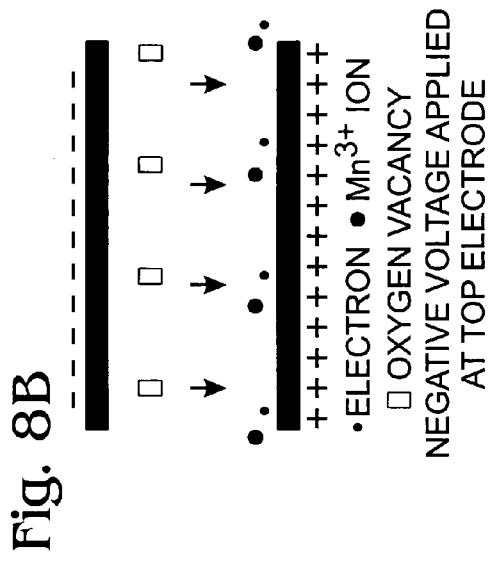
FIGS. 8A and 8B are drawings showing the direction from $Mn^{3+}$ ions in $PrMnO_3$, to oxygen vacancies, oriented toward a top electrode.
Figure 8B:
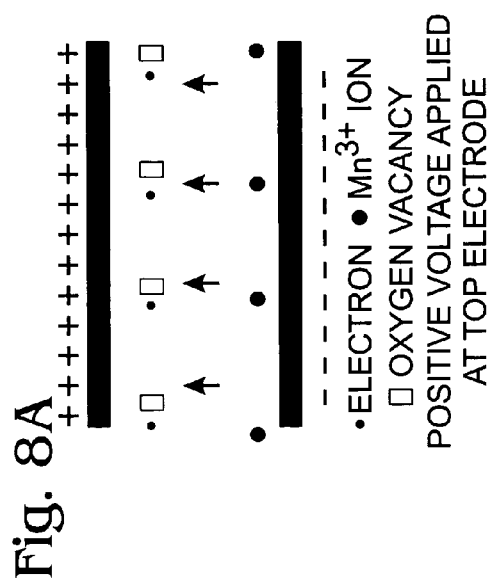

FIGS. 8A and 8B are drawings showing the direction from $Mn^{3+}$ ions in $PrMnO_3$, to oxygen vacancies, oriented toward a top electrode. In FIG. 8A, a positive voltage is applied to the top electrode. In FIG. 8B, a negative voltage is applied to the top electrode. From above analysis, the ordering and orientation of $PrMnO_3$ and $CaMnO_3$ units and distribution of oxygen vacancies are very important for the electrically alterable resistive properties of PCMO materials. If the distribution of $PrMnO_3$ and $CaMnO_3$ subunits and oxygen vacancies are random, then material does not show a strong electrically alterable resistance. According to equation 3, $CaMnO_3$ subunits may have $Mn^{3+}$ ions and oxygen vacancies under certain conditions. Due to the distortion of $PrMnO_3$ subunits, oxygen vacancies may be formed on the boundaries between $CaMnO_3$ and $PrMnO_3$ units.

Figure 9A:
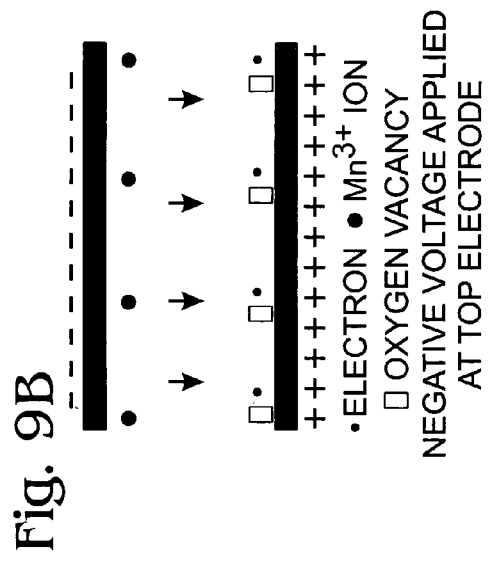
FIGS. 9A and 9B are drawings depicting the direction of electron flow when opposite polarity pulses are applied to the top electrode.
Figure 9B:
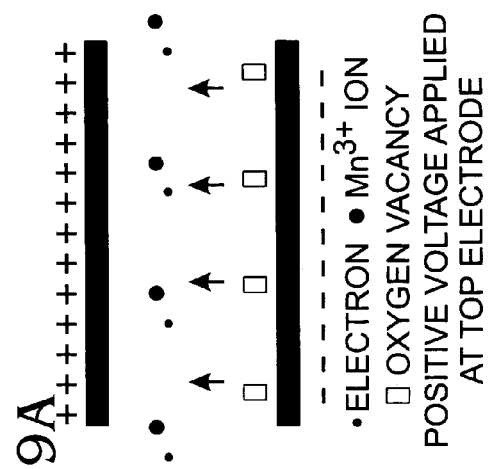

FIGS. 9A and 9B are drawings depicting the direction of electron flow when opposite polarity pulses are applied to the top electrode. The free valence electrons of the $Mn^{3+}$ ions transfer to oxygen vacancies if a positive pulsed voltage is applied to the top electrode (FIG. 9A). In this case, the material shows conductor properties. On the contrary, free valence electrons in oxygen vacancies transfer back to the $Mn^{3+}$ ions if a negative pulsed voltage is applied to the top electrode at and the material shows insulating properties (FIG. 9B). If the directions from the $Mn^{3+}$ ions to oxygen vacancies are oriented toward the bottom electrode, then the behavior relative to the potential of an applied pulse is reversed. In this way, electrically alterable resistive properties of PCMO materials may be obtained.

Double Exchange Interactions $Mn^{3+}$—$O^{2-}$—$Mn^{4+}$

FIGS. 10A and 10B are drawings showing the directionality of electron jumps between $Mn^{3+}$ and $Mn^{4+}$ ions. Alternatively, the formation of $Mn^{3+}$ ions and oxygen vacancies in $CaMnO_3$ units enhances the double exchange interactions $Mn^{3+}$—$O^{2-}$—$Mn^{4+}$ between $CaMnO_3$ and $PrMnO_3$ unit layers. The free valence electrons of the $Mn^{3+}$ ions in $PrMnO_3$ subunit layers transfer to $CaMnO_3$ subunit layers if a positive pulsed voltage is applied to the top electrode, and the material shows conductor properties. On the contrary, the free valence electrons in $CaMnO_3$ subunit layers transfer back to $PrMnO_3$ subunit layers if a negative pulsed voltage is applied to the top electrode, and the material shows insulating properties.

FIGS. 11A and 11B show electron flow when the $PrMnO_3$ and $CaMnO_3$ subunit layers are reversed with respect to the bottom electrode. Then, the material shows a behavior opposite of the behavior shown in FIGS. 10A and 10B.

The Relationship Between PCMO Composition and Electrically Alterable Resistance

Based on the above analysis, the composition of the $Pr_{1-x}Ca_xMnO_3$ thin films significant affect electrically alterable resistance properties. Experimental results show that PCMO materials with 0.1<x<0.6 exhibit electrically alterable resistance, and, in particular, PCMO materials with x=0.3, or close to this value, show the largest effect.

Crystallographic Orientation

The orientations of PCMO thin films show a significant affect upon electrically alterable resistance properties. Perfectly oriented and crystallized PCMO films, or epitaxial (single-crystal) PCMO with a smaller concentration of $Mn^{3+}$ ions, have a higher resistance, and the largest change in resistance responsive to the application of an electric field. Due to higher activation energy (or barrier energy) for the transfer of electrons between $Mn^{3+}$ and $Mn^{4+}$, a higher operation voltage is required and the non-volatile (retention, endurance, etc.) properties are good. Of course, a reduction of the film thickness can reduce operation the voltage, which allows the resistance of the alterable resistor to be set at an optimum value. For perfectly oriented and crystallized PCMO films or epitaxial PCMO thin films, the main electrically alterable resistance properties of PCMO materials come from double exchange interactions $Mn^{3+}$—$O^2$—$Mn^{4+}$. Oxygen vacancies enhance the double exchange interactions $Mn^{3+}$—$O^2$—$Mn^{4+}$. This is the so-called bipolar case, for which resistance is raised and lowered reversibly by the application of short duration pulses of opposite polarity.

The orientation plays an important role in the bipolar switching properties. Table 2 shows the density of Mn atoms and the nearest distance between two Mn atoms, along with orientations. According to calculations, the PCMO thin films with (110) and (001) orientations have the best bipolar switching properties.

TABLE 2

The densities of Mn atoms and distance between two Mn atoms of PCMO materials

| Orientation | Densities of Mn atoms (number per 100 Å²) | Distance between two Mn atoms (Å) |
| --- | --- | --- |
| (100) | 4.75 | 5.426 |
| (010) | 4.80 | 5.478 |
| (001) | 6.73 | 3.840 |
| (110) | 6.76 | 3.855 |
| (011) | 3.91 | 6.690 |
| (101) | 3.36 | 6.647 |

FIGS. 12A, 12B, 12C depict the (110), (011), and (101) orientations, respectively, of PCMO thin films. FIG. 12A shows the (110) orientation (marked ABCD) of a PCMO thin film. From the figure, the highest density of 6.76 per 100 Å² area of Mn atoms and shorter distance (about 3.855 Å) between two Mn atoms lies along the (110) direction. Therefore, the strongest electrically alterable resistance can be obtained. Due to the lower density of Mn atoms and longer distance along (011) or (101), electrically alterable resistive properties will be weaker for films oriented in these directions, as shown in FIGS. 12B and 12C, respectively.

Figure 13:
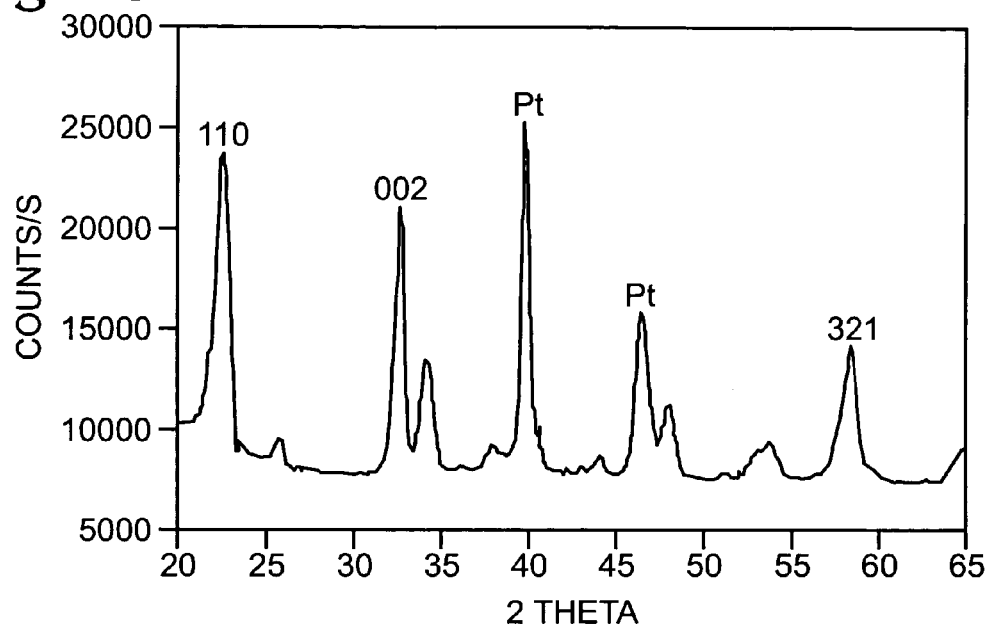
FIG. 13 shows an x-ray pattern of PCMO with partial (110) orientation.

FIG. 13 shows an x-ray pattern of PCMO with partial (110) orientation. The sample shows good bipolar switching properties.

Figure 14A:
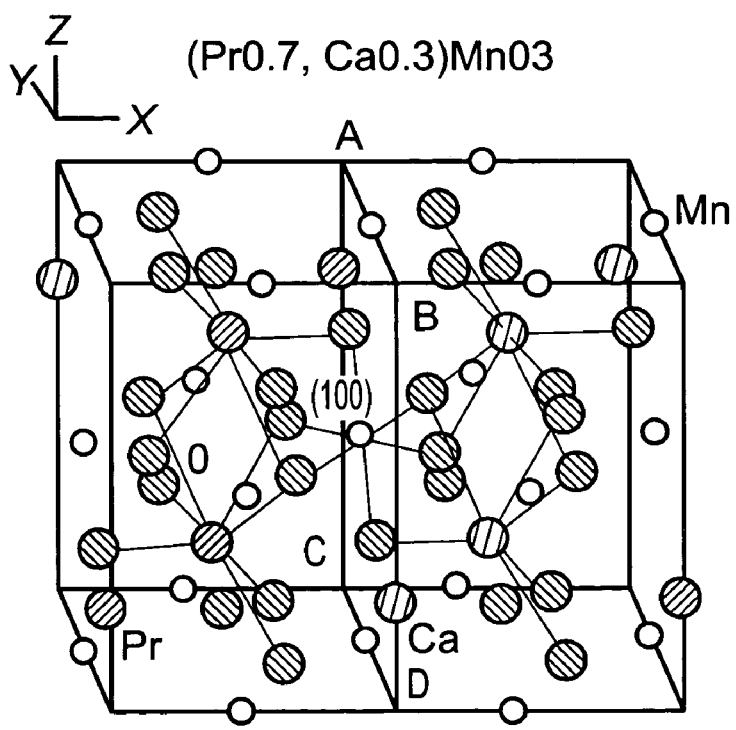
FIGS. 14A and 14B depict the (100) and (010) orientations of PCMO thin films, respectively.
Figure 14B:
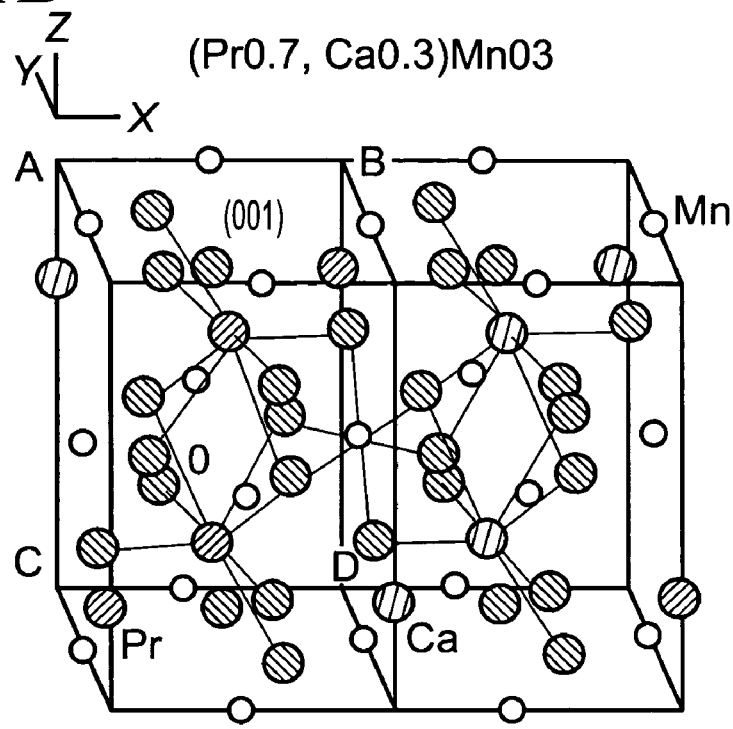

FIGS. 14A and 14B depict the (100) and (010) orientations of PCMO thin films, respectively. FIG. 14A shows the (100) orientation (marked ABCD) of PCMO thin films. Compared with (110) orientation, the density of 4.75 per 100 Å² area of Mn atoms along the (100) direction is lower than in the (110) orientation, and the distance (about 5.426 Å) between two Mn atoms of (100) orientation is longer than that of (110) orientation. Therefore, the switching properties of (110) orientation are better than (100) orientation. In addition, the (010) orientation is similar to (100) orientation, as shown in FIG. 14B.

Figure 15:
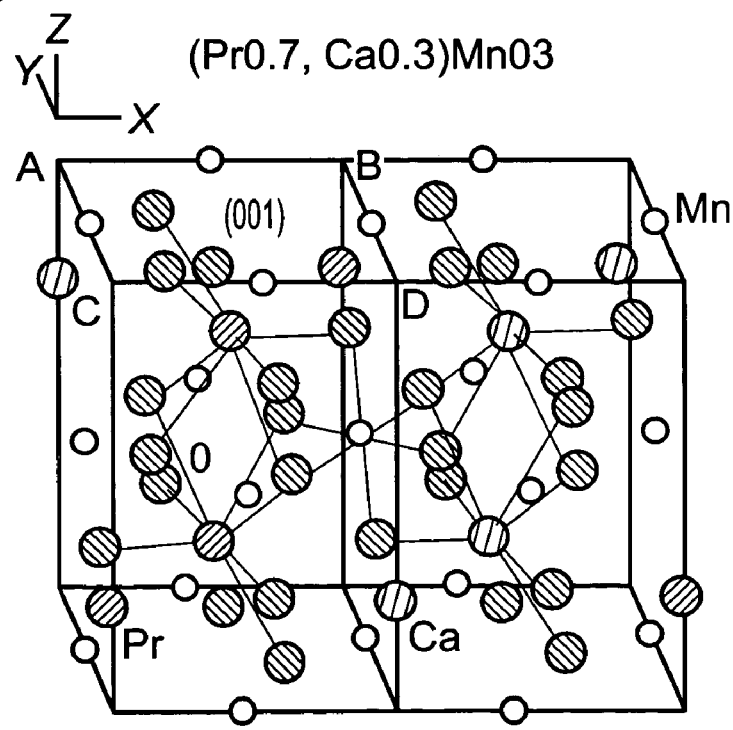
FIG. 15 shows the (001) orientation (marked ABCD) of PCMO thin films.

FIG. 15 shows the (001) orientation (marked ABCD) of PCMO thin films. Compared with (110) orientation, the density of 6.73 per 100 Å² area of Mn atoms along with the (001) direction is similar to (110) orientation, and the distance about 3.84 Å between two Mn atoms is also similar to (110) orientation. Therefore, the switching properties of (110) orientation are similar to the (001) orientation.

Figure 16:
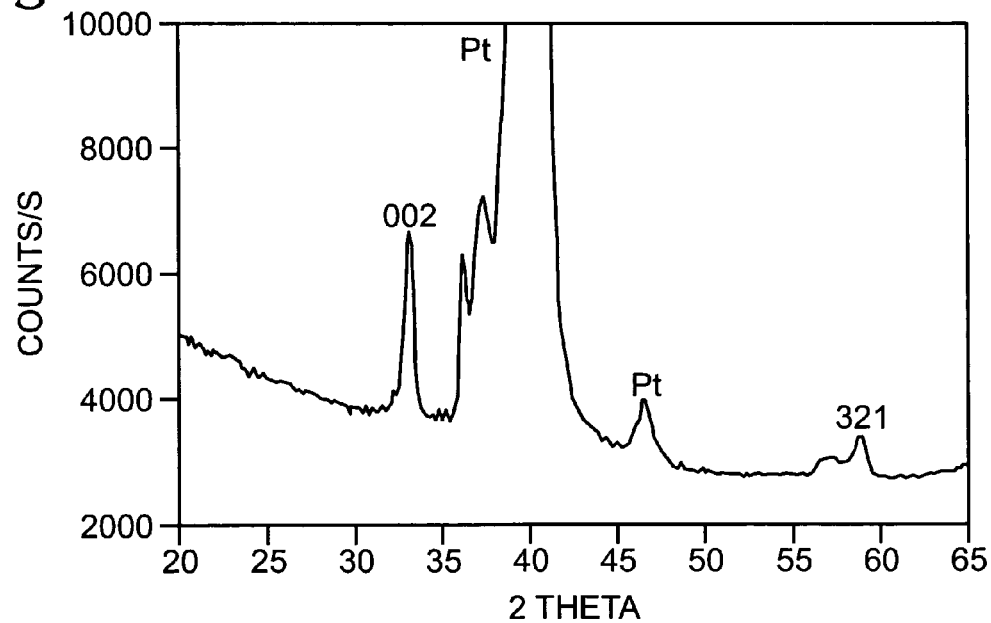
FIG. 16 shows the x-ray pattern of PCMO thin films with (001) orientation.

FIG. 16 shows the x-ray pattern of PCMO thin films with (001) orientation.

Figure 17:
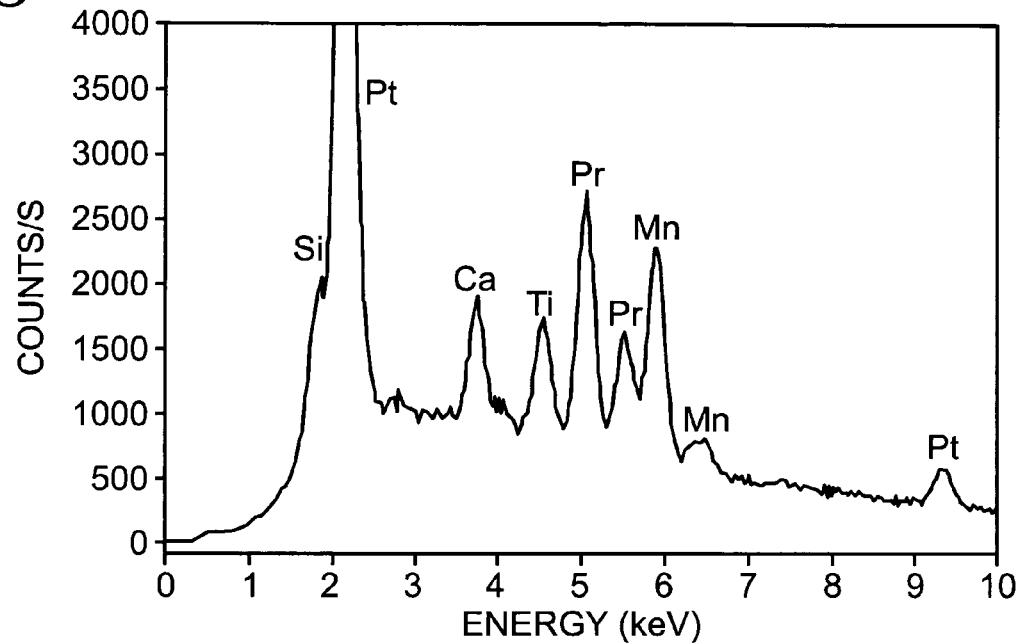
FIG. 17 depicts the EDX pattern of the PCMO thin film of FIG. 16.

FIG. 17 depicts the EDX pattern of the PCMO thin film of FIG. 16.

Figure 18:
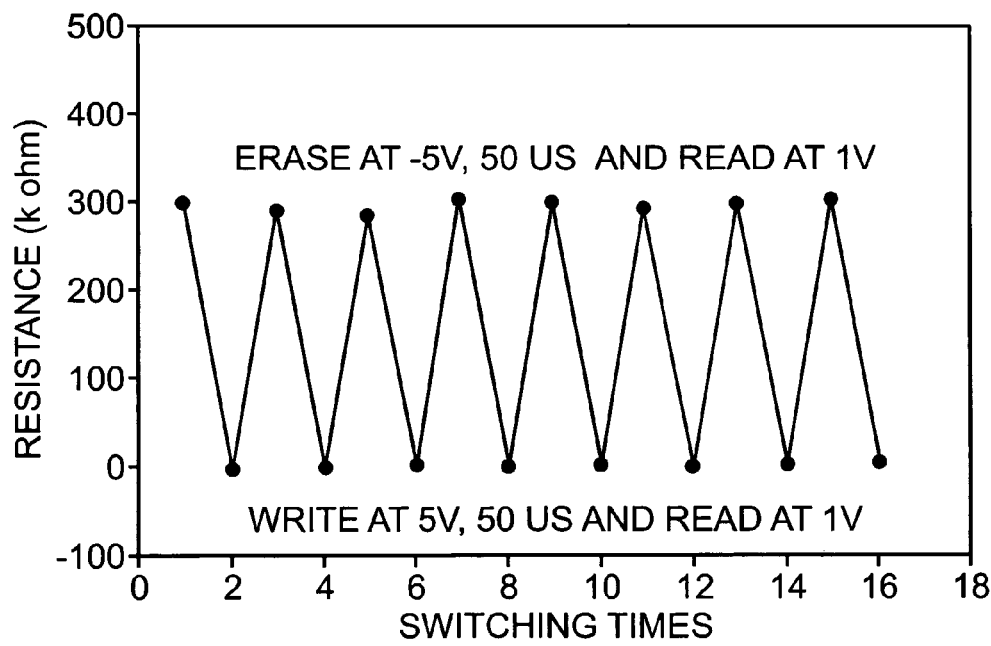
FIG. 18 depicts the switching properties of c-axis oriented PCMO thin films.

FIG. 18 depicts the switching properties of c-axis oriented PCMO thin films. The sharp (002) peak (FIG. 16) confirms the formation of C-oriented PCMO thin film. The energy dispersion x-ray analysis (EDX) measurement shows that the composition of the PCMO thin film is close to $Pr_{0.7}Ca_{0.3}MnO_3$, as shown in FIG. 17. The PCMO thin film shows very good bipolar switching properties, as shown in FIG. 18, which is consistent with the above calculations.

The use of oriented polycrystalline PCMO films may result in a reduction in the operation voltage. But the resistance and ratio of higher resistive state to the lower resistive state is also decreased, and retention and endurance may be degraded.

By increasing $Mn^{3+}$ ions, defects such as oxygen vacancy occur, and the barrier energy for transformation of electrons between $Mn^{3+}$ and $Mn^{4+}$ decreases. Therefore, resistance and operation voltage may decrease, but retention properties may be degraded. If the ratio of $Mn^{3+}/Mn^{4+}$ ions is too high, the CMR materials are conductive.

The amount, distribution, and orientation of oxygen vacancies and defects have an effect upon switching properties. The distribution and orientation of groups of $PrMnO_3$ and $CaMnO_3$ have an affect upon the switching properties. There are optimum ratios of about 1-4 of $Mn^{3+}/Mn^{4+}$ and Pr/Ca for RRAM applications.

Crystallization and Switching Properties

When perfectly crystallized PCMO materials change into polycrystalline or amorphous PCMO materials, the oxygen vacancies and defects increase. The main reversible resistive switching mechanism of PCMO materials includes electron exchange or electron trapping between $Mn^{3+}$—$O^2$—$Mn^{4+}$, and oxygen vacancies or defects, resulting in unipolar switching.

FIG. 19 shows the x-ray pattern of a PCMO thin film with nanosized polycrystalline materials. Based on calculations, the PCMO gain size is about 40 nm.

FIG. 20 depicts the unipolar switching properties of the PCMO thin film of FIG. 19. The write, high resistance state is achieved by applying 5V for 100 ns. The erase, lower resistance state results from applying 3V for 10 µs.

Figure 22:
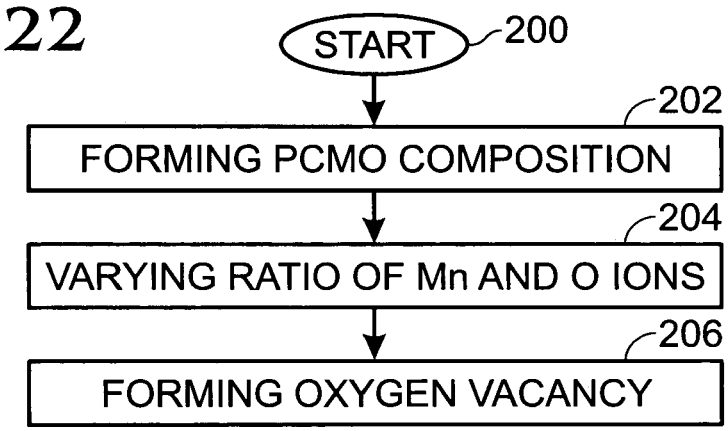
FIGS. 22 through 27 are flowcharts illustrating different aspects of the present invention method for forming a PrCaMnO (PCMO) thin film with predetermined memory-resistance characteristics.

FIG. 22 is a flowchart illustrating the present invention method for forming a PrCaMnO (PCMO) thin film with predetermined memory-resistance characteristics. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 200.

Step 202 forms a $Pr^{3+}_{1-x}Ca^{2+}_{x}MnO$ thin film composition, where $0.1<x<0.6$. Step 204, in response to the selection of x, varies the ratio of Mn and O ions as follows:

$O^{2-}(3\pm20\%)$;
$Mn^{3+}((1-x)\pm20\%)$; and,
$Mn^{4+}(x\pm20\%)$.

If Step 202 forms a PCMO thin film with a $Pr^{3+}_{0.70}Ca^{2+}_{0.30}Mn^{3+}_{0.78}Mn^{4+}_{0.22}O^{2-}_{2.96}$ composition, then Step 204 varies the ratio of ions as follows:

$O^{2-}(2.96)$;
$Mn^{3+}((1-x)+8\%)$; and,
$Mn^{4+}(x-8\%)$.

In one aspect, a further step, Step 206 forms a 13.3% oxygen vacancy in the PCMO film.

Figure 23:
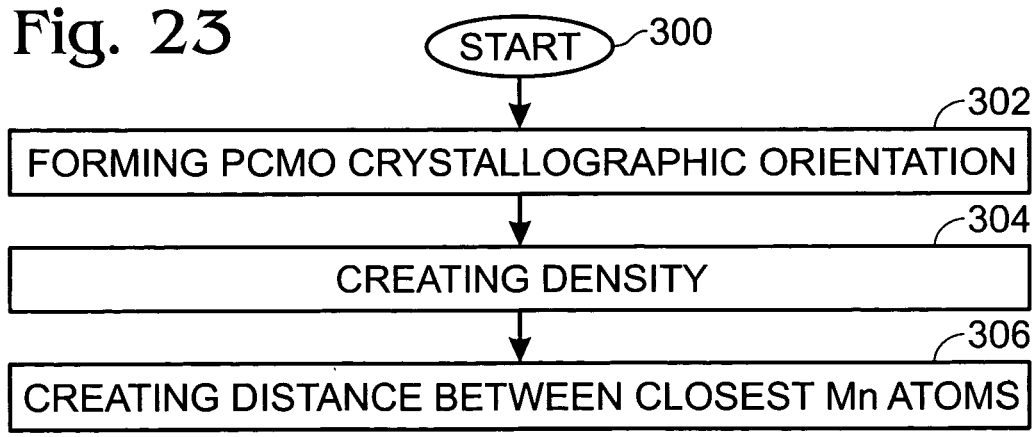

FIG. 23 is a flowchart illustrating a second aspect of the present invention method for forming a $Pr^{3+}_{1-x}Ca^{2+}_{x}Mn^{3+}_{(1-x)\pm20\%}Mn^{4+}_{x\pm20\%}O^{2-}_{3\pm20\%}$ (PCMO) thin film with predetermined memory-resistance characteristics. The method starts at Step 300. Step 302 forms a PCMO thin film with a crystallographic orientation. Step 304 creates a density in the PCMO film, responsive to the orientation.

In one aspect, Step 302 forms a PCMO film in a (110) orientation. Then, Step 304 creates a density in the range of 5 to 6.76 Mn atoms per 100 Å² in a plane perpendicular to the (110) orientation. In one aspect a further step, Step 306, creates a distance of 3.855 Å between the two closest Mn atoms in response to the (110) orientation.

If Step 302 forms a PCMO film in a (001) orientation, then Step 304 creates a density in the range of 5 to 6.73 Mn atoms per 100 Å² in a plane perpendicular to the (001) orientation, and Step 306 creates a distance of 3.840 Å between the two closest Mn atoms in response to the (001) orientation.

Figure 24:
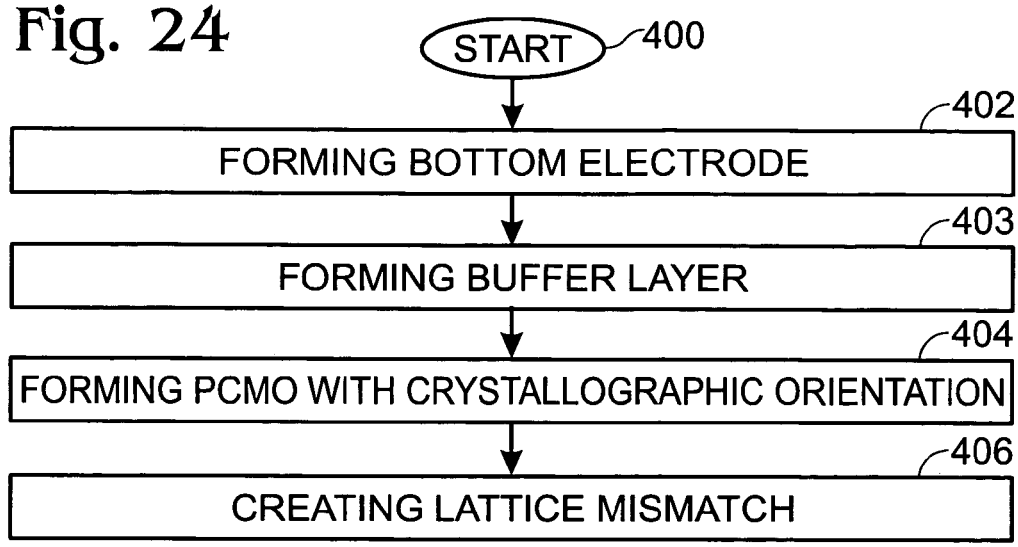

FIG. 24 is a flowchart the present invention method for forming a $Pr^{3+}_{1-x}Ca^{2+}_{x}Mn^{3+}_{(1-x)\pm20\%}Mn^{4+}_{x\pm20\%}O^{2-}_{3\pm20\%}$ (PCMO) thin film memory-resistance device. The method starts at Step 400. Step 402 forms a bottom electrode from a material such as Pt, Ir, Al, or TiN. Step 404 forms a PCMO thin film with a crystallographic orientation overlying the bottom electrode. Step 406 creates a lattice mismatch in the PCMO film, responsive to the orientation, between the PCMO thin film and the bottom electrode. In some aspects, Step 403 forms a buffer layer interposed between the PCMO thin film and the bottom electrode formed from a material such as InO2 or ZnO.

If Step 402 forms a PCMO film in a (110) orientation, then Step 404 creates a lattice mismatch of less than 30% between the PCMO thin film and the bottom electrode. If Step 402 forms a PCMO film in a (001) orientation, Step 404 also creates a lattice mismatch of less than 30% between the PCMO thin film and the bottom electrode.

Figure 25:
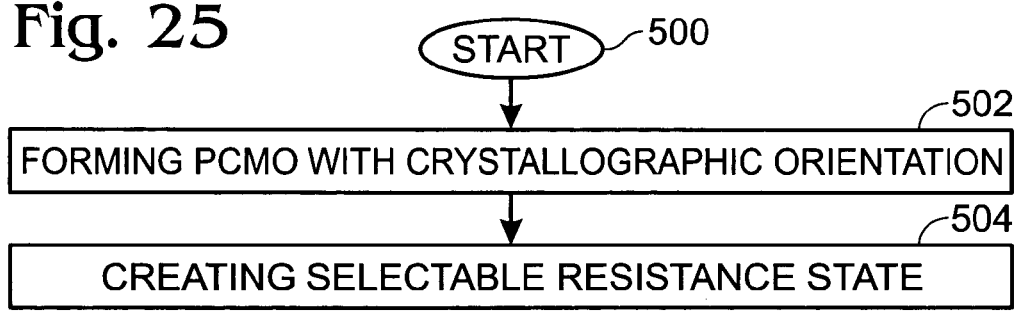

FIG. 25 is a flowchart illustrating a fourth aspect of the present invention method for forming a $Pr^{3+}_{1-x}Ca^{2+}_{x}Mn^{3+}_{(1-x)\pm20\%}Mn^{4+}_{x\pm20\%}O^{2-}_{3\pm20\%}$ (PCMO) thin film with predetermined memory-resistance characteristics. The method starts at Step 500. Step 502 forms a PCMO thin film with a crystallographic orientation. Step 504 creates a PCMO film with a selectable resistance state, responsive to the orientation.

If Step 502 forms a PCMO film in a (001) orientation, then Step 504 creates a PCMO film with a selectable resistance state, responsive to the orientation, by:

writing a high resistance in the range of 10 to 1000 kilo ohms, using ±(2 to 10) V pulse, with a duration in the range of 5 ns to 50 microseconds; or, resetting a low resistance in the range of 500 ohms to 10 kilo ohms, using ±(2 to 10) V pulse, with a duration in the range of 5 ns to 50 microseconds.

If Step 502 forms a PCMO film in a (110) orientation, then Step 504 creates a PCMO film with a selectable resistance state, responsive to the orientation, by:

writing a high resistance in the range of 10 to 1000 kilo ohms, using ±(2 to 10) V pulse, with a duration in the range of 5 ns to 50 microseconds; or, resetting a low resistance in the range of 500 ohms to 10 kilo ohms, using ±(2 to 10) V pulse, with a duration in the range of 5 ns to 50 microseconds.

Figure 26:
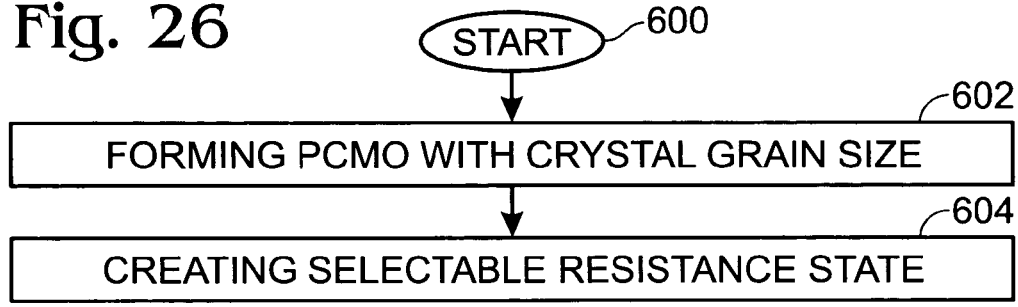

FIG. 26 is a flowchart illustrating a fifth aspect of the present invention method for forming a $Pr^{3+}_{1-x}Ca^{2+}_{x}Mn^{3+}_{(1-x)\pm20\%}Mn^{4+}_{x\pm20\%}O^{2-}_{3\pm20\%}$ (PCMO) thin film with predetermined memory-resistance characteristics. The method starts at Step 600. Step 602 forms a PCMO thin film with a crystal grain size. Step 604 creates a PCMO film with a selectable resistance state, responsive to the grain size.

If Step 602 forms a PCMO film with a crystal grain size in the range of 3 to 40 nm, then Step 604 creates a PCMO film with a selectable resistance state, responsive to the orientation, by:

writing a high resistance of greater than 225 kilo ohms, using 5 V pulse of less than 100 ns; or, resetting a low resistance of less than 10 kilo ohms, using a 3 V pulse of less than 10 microseconds.

If Step 602 forms a PCMO film with a crystal grain size in the range of 40 nm to epitaxial, then Step 604 creates a PCMO film with a selectable resistance state, responsive to the orientation, by:

writing a high resistance of greater than 300 kilo ohms, using −5 V pulse of less than 50 microseconds; or, resetting a low resistance of less than 10 kilo ohms, using a +5 V pulse of less than 50 microseconds.

Figure 27:
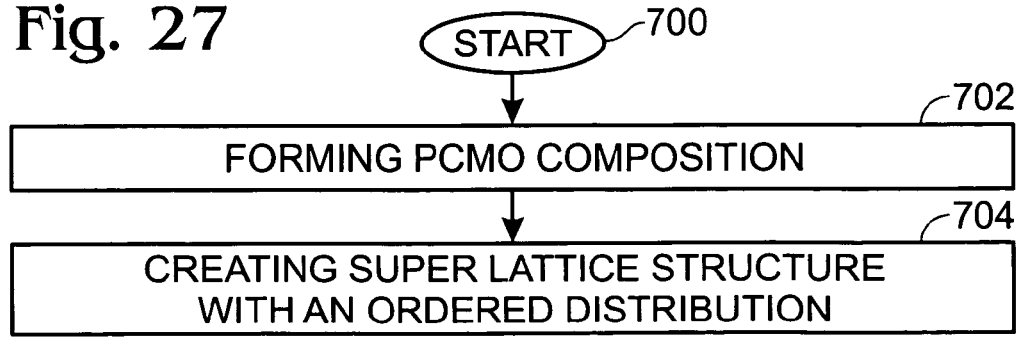

FIG. 27 is a flowchart illustrating a sixth aspect of the present invention method for forming a $Pr^{3+}_{1-x}Ca^{2+}_{x}Mn^{3+}_{(1-x)\pm20\%}Mn^{4+}_{x\pm20\%}O^{2-}_{3\pm20\%}$ (PCMO) thin film with predetermined memory-resistance characteristics. The method starts at Step 700. Step 702 forms a PCMO thin film with a composition. Step 704 creates a super lattice structure with an ordered distribution in the PCMO film, responsive to the composition.

If Step 702 forms a PCMO thin film with a $Pr^{3+}_{0.50}Ca^{2+}_{0.50}MnO_{0.3}$ composition, then Step 704 creates a distribution of:

$Z(Mn^{3+})PrMnO_3:Z(Mn^{4+})CaMnO_3$ subunits, where Z is a natural number.

If Step 702 forms a PCMO thin film with a $Pr^{3+}_{0.67}Ca^{2+}_{0.33}MnO_{0.3}$ composition, Step 704 creates a distribution of:

$2Z(Mn^{3+})PrMnO_3:Z(Mn^{4+})CaMnO_3$ subunits, where Z is a natural number.

If Step 702 forms a PCMO thin film with a $Pr^{3+}_{0.75}Ca^{2+}_{0.25}MnO_{0.3}$ composition, Step 704 creates a distribution of:

$3Z(Mn^{3+})PrMnO_3:Z(Mn^{4+})CaMnO_3$ subunits, where Z is a natural number.

PCMO thin films and associated formation processes have been presented. Some examples of resistance-memory characteristics, and related features, have been presented cross-referenced to PCMO film attributes to clarify the invention.

However, the invention is not limited to merely these examples. Other variations and embodiments of the invention will occur to those skilled in the art.

We claim:

1. A method for forming a PrCaMnO (PCMO) thin film with predetermined memory-resistance characteristics, the method comprising:

forming a $Pr^{3+}_{1-x}Ca^{2+}_{x}MnO$ thin film composition, where $0.1 < x < 0.6$;

in response to the selection of x, varying the ratio of Mn and O ions as follows:
$O^{2-}(3\pm20\%)$;
$Mn^{3+}((1-x)\pm20\%)$; and,
$Mn^{4+}(x\pm20\%)$.

2. The method of claim 1 wherein forming a PCMO thin film with a composition includes forming a PCMO thin film with a $Pr^{3+}_{0.70}Ca^{2+}_{0.30}Mn^{3+}_{0.78}Mn^{4+}_{0.22}O^{2-}_{2.96}$ composition;

wherein varying the ratio of Mn and O ions includes varying the ions as follows:
$O^{2-}(2.96)$;
$Mn^{3+}((1-x)+8\%)$; and,
$Mn^{4+}(x-8\%)$.

3. The method of claim 2 further comprising:
forming a 13.3% oxygen vacancy in the PCMO film.

4. A PrCaMnO (PCMO) thin film with predetermined memory-resistance characteristics, the PCMO thin film comprising:

a $Pr^{3+}_{1-x}Ca^{2+}_{x}MnO$ composition, where $0.1 < x < 0.6$; and,
a ratio of Mn and O ions as follows:
$O^{2-}(3\pm20\%)$;
$Mn^{3+}((1-x)\pm20\%)$; and,
$Mn^{4+}(x\pm20\%)$.

5. The PCMO thin film of claim 4 wherein the composition is $Pr^{3+}_{0.70}Ca^{2+}_{0.30}Mn^{3+}_{0.78}Mn^{4+}_{0.22}O^{2-}_{2.96}$; and,
wherein the ratio of Mn and O ions is as follows:
$O^{2-}(2.96)$;
$Mn^{3+}((1-x)+8\%)$; and,
$Mn^{4+}(x-8\%)$.

6. The PCMO thin film of claim 5 further comprising a 13.3% oxygen vacancy.

* * * * *

UNITED STATES PATENT AND TRADEMARK OFFICE
CERTIFICATE OF CORRECTION

| | |
|---|---|
| PATENT NO. | : 7,060,586 B2 |
| APPLICATION NO. | : 10/836689 |
| DATED | : June 13, 2006 |
| INVENTOR(S) | : Tingkai Li et al. |

It is certified that error appears in the above-identified patent and that said Letters Patent is hereby corrected as shown below:

Col. 1, line 54, the term "0.70" and "0.30" should be subscripts.-

Signed and Sealed this

Twenty-second Day of August, 2006

JON W. DUDAS
*Director of the United States Patent and Trademark Office*